(12) United States Patent
Kang et al.

(10) Patent No.: US 12,405,303 B2
(45) Date of Patent: Sep. 2, 2025

(54) SCAN CHAIN SECURITY CIRCUIT AND DRIVING METHOD THEREOF

(71) Applicant: UIF (University Industry Foundation), Yonsei University, Seoul (KR)

(72) Inventors: Sungho Kang, Seoul (KR); Seokjun Jang, Paju-si (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 109 days.

(21) Appl. No.: 18/395,745

(22) Filed: Dec. 26, 2023

(65) Prior Publication Data

US 2024/0280633 A1  Aug. 22, 2024

(30) Foreign Application Priority Data

Feb. 22, 2023  (KR) ........................ 10-2023-0023654

(51) Int. Cl.
*G01R 31/317*  (2006.01)
*G01R 31/3185*  (2006.01)

(52) U.S. Cl.
CPC ............. *G01R 31/31719* (2013.01); *G01R 31/318536* (2013.01); *G01R 31/318572* (2013.01)

(58) Field of Classification Search
CPC ...... G01R 31/31719; G01R 31/318536; G01R 31/318572; G01R 31/318541;

(Continued)

(56) References Cited

U.S. PATENT DOCUMENTS 11,567,132 B2 *  1/2023  Kang ................. G01R 31/3275
12,282,063 B1 *  4/2025  Gizdarski ...... G01R 31/318541
(Continued)

FOREIGN PATENT DOCUMENTS

JP  2011107930 A  *  6/2011
KR  10-0435259 B1  9/2004
(Continued)

OTHER PUBLICATIONS

Karmakar, Rajit et al. "Encrypt Flip-Flop: A Novel Logic Encryption Technique For Sequential Circuits." ArXiv abs/1801.04961 (2018) (Year: 2018).*

(Continued)

*Primary Examiner* — Michael R Vaughan
(74) *Attorney, Agent, or Firm* — Park, Kim & Suh, LLC

(57) ABSTRACT

A scan chain security circuit includes a scan chain including at least one flip-flop, a scan path obfuscator to obfuscate a path of a pattern sequence input to at least one first flip-flop grouped at an input side of the scan chain, in response to a first control signal, a scan path normalizer to normalize the path of the pattern sequence input to at least one second flip-flop grouped at an outside of the scan chain, in response to a second control signal, at least one dummy flip-flop interposed between the at least one first flip-flop and the at least one second flip-flop to receive a test key included in the pattern sequence, and a scan data obfuscator to damage and obfuscate an output pattern sequence output from the at least one second flip-flop, depending on whether a security key stored in a memory of a chip to be inspected is matched with the test key.

11 Claims, 4 Drawing Sheets

(58) Field of Classification Search
CPC . G01R 31/318588; G06F 21/75; G06F 21/14; G06F 21/33; G06F 21/36

See application file for complete search history.

(56) References Cited

U.S. PATENT DOCUMENTS

| | | | |
|---|---|---|---|
| 2019/0258766 A1* | 8/2019 | Wang | H01L 21/02107 |
| 2020/0065456 A1* | 2/2020 | Tehranipoor | G06F 21/14 |
| 2022/0188387 A1* | 6/2022 | Bhunia | G06F 21/121 |
| 2023/0096746 A1* | 3/2023 | Woo | G01R 31/318544 |
| | | | 702/58 |
| 2023/0177245 A1* | 6/2023 | Sinanoglu | G09C 1/00 |
| | | | 716/100 |
| 2023/0260857 A1* | 8/2023 | Yuan | G01R 31/2884 |
| | | | 257/48 |
| 2023/0288477 A1* | 9/2023 | Chakrabarty | G01R 31/31703 |

FOREIGN PATENT DOCUMENTS

| | | | | |
|---|---|---|---|---|
| KR | 10-2004-0104678 A | | 12/2004 | |
| KR | 10-0595534 B1 | | 6/2006 | |
| KR | 10-2009-0007433 A | | 1/2009 | |
| KR | 10-2013-0040202 A | | 4/2013 | |
| KR | 102273138 B1 | * | 7/2021 | ..... G01R 31/318536 |
| KR | 10-2022-0117825 A | | 8/2022 | |
| TW | 561270 B | * | 11/2003 | ..... G01R 31/318541 |
| TW | 202403914 A | * | 1/2024 | ..... G01R 31/318588 |
| WO | WO-2009106428 A1 | * | 9/2009 | ........... G06F 21/755 |

OTHER PUBLICATIONS

Dongrong Zhang, Miao He, Xiaoxiao Wang and M. Tehranipoor, "Dynamically obfuscated scan for protecting IPs against scan-based attacks throughout supply chain," 2017 IEEE 35th VLSI Test Symposium (VTS), Las Vegas, NV, 2017, pp. 1-6, (Year: 2017).*

X. Li, W. Li, J. Ye, H. Li and Y. Hu, "Scan Chain Based Attacks and Countermeasures: A Survey," in IEEE Access, vol. 7, pp. 85055-85065, 2019 (Year: 2019).*

M. A. Razzaq, V. Singh and A. Singh, "SSTKR: Secure and Testable Scan Design through Test Key Randomization," 2011 Asian Test Symposium, New Delhi, India, 2011, pp. 60-65 (Year: 2011).*

M Sazadur Rahman, et al. 2021. Security Assessment of Dynamically Obfuscated Scan Chain Against Oracle-guided Attacks. ACM Trans. Des. Autom. Electron. Syst. 26, 4, Article 29 (Jul. 2021), 27 pages (Year: 2021).*

H. Huang, X. Cui, S. Zhang, G. Li and X. Cui, "An obfuscation scheme of scan chain to protect the cryptographic chips," 2022 IEEE 31st Asian Test Symposium (ATS), Taichung City, Taiwan, 2022, pp. 19-24 (Year: 2022).*

Saranyadevi. S, et al., "A Low Power Structure Design of 2D-LFSR and Encoding Technique for BIST", International Journal of Advanced Science and Technology, vol. 18, May 2010, 12 pages.

* cited by examiner

| $N_{sg}$ = 2 | |
|---|---|
| $obf_0$ | $obf_1$ |
| 0 | 0 |
| 1 | 1 |

| $N_{sg}$ = 3 | | | |
|---|---|---|---|
| $obf_0$ | $obf_1$ | $nor_0$ | $nor_1$ |
| 0 | 0 | 0 | 0 |
| 0 | 1 | 1 | 1 |
| 1 | 0 | 1 | 1 |
| 1 | 1 | 1 | 0 |

| $N_{sg}$ = 4 | | | | | |
|---|---|---|---|---|---|
| $obf_0$ | $obf_1$ | $obf_2$ | $nor_0$ | $nor_1$ | $nor_2$ |
| 0 | 0 | 0 | 0 | 0 | 0 |
| 0 | 0 | 1 | 1 | 1 | 1 |
| 0 | 1 | 0 | 1 | 1 | 1 |
| 0 | 1 | 1 | 1 | 1 | 0 |
| 1 | 0 | 0 | 1 | 1 | 1 |
| 1 | 0 | 1 | 1 | 1 | 0 |
| 1 | 1 | 0 | 0 | 1 | 1 |
| 1 | 1 | 1 | 1 | 0 | 0 |

SCAN CHAIN SECURITY CIRCUIT AND DRIVING METHOD THEREOF

CROSS-REFERENCE TO RELATED APPLICATIONS

This application claims the benefit of Korean Patent Application No. 10-2023-0023654, filed on Feb. 22, 2023, in the Korean Intellectual Property Office, the disclosure of which is incorporated herein in its entirety by reference

TECHNICAL FIELD

Embodiments of the present disclosure described herein relate to a scan chain security circuit and a method for driving the same.

BACKGROUND

A scan chain security technology has evolved ranging from a primitive static obfuscation scheme, which includes inverts or XOR gates merely placed at specific points within a scan region, to a pattern recognizing scheme which requires an intrinsic security key for each patter, which is input by dynamically obfuscating an output value, when an input test key is mismatched with a single security key stored in a circuit.

However, according to the above schemes, the security key may be easily extracted by analyzing a pattern including a testing security key provided to for a test engineer, when a circuit structure is exposed through reverse engineering. This is a major vulnerability in a modern semiconductor industry environment where design houses, manufacturers, and field test engineers are separated from each other.

Accordingly, there has been suggested to security technologies based on a pattern authenticating scheme for normally outputting a test result only when a test key input together with a pattern is matched with a security key for the relevant pattern by providing a unique security key as a countermeasure for each pattern.

However, even in this time, each pattern and the security key have one-to-one correspondence. Accordingly, when a plurality of patterns provided to a test engineer are analyzed, an algorithm for generating a security key is inferred with respect to each pattern to generate the provided pattern and additional patterns for attack, such that the patterns are inserted into the circuit.

Accordingly, there may be required a technology for completely blocking a security key used by an attacker or the probability of inference made by inputting a security key, even if patterns including the security key are exposed through a test engineer under the situation in which the reverse engineering is applied.

The present disclosure is derived from research conducted as part of an individual basic research by the Ministry of Science and ICT (MSIT) (Project No.; 1711155604, Project No.; 2022R1A2B5B03002504, Research project name; Technology of designing semiconductor for improving robustness of in-memory computing, project management institution; National Research Foundation of Korea, task performing institution; Yonsei University, research period; Mar. 1, 2022 to Feb. 28, 2023). Meanwhile, there is no property interest of the Korean government in any aspect of the present disclosure.

DETAILED DESCRIPTION OF THE INVENTION

Technical Problem

Embodiments of the present disclosure provide a scan chain security circuit for determining a shifting path for inputting a following pattern, based on a preceding pattern, as patterns subsequently input have correlation, such that the one-to-one correspondence between the pattern and the security key is removed.

Technical Solution

According to an embodiment of the present disclosure, a scan chain security circuit includes a scan chain including at least one flip-flop, a scan path obfuscator to obfuscate a path of a pattern sequence input to at least one first flip-flop grouped at an input side of the scan chain, in response to a first control signal, a scan path normalizer to normalize the path of the pattern sequence input to at least one second flip-flop grouped at an outside of the scan chain, in response to a second control signal, at least one dummy flip-flop interposed between the at least one first flip-flop and the at least one second flip-flop to receive a test key included in the pattern sequence, and a scan data obfuscator to damage and obfuscate an output pattern sequence output from the at least one second flip-flop, depending on whether a security key stored in a memory of a chip to be inspected is matched with the test key In addition, according to an embodiment of the present disclosure, the at least one first flip-flop receives only a first pattern, which includes only a test pattern, in the pattern sequence, and sequentially receives a second pattern to an N-th pattern including the test key and the test pattern after the first pattern, in which "N" is a natural number.

In addition, according to an embodiment of the present disclosure, the scan path obfuscator groups "M" columns of the scan chain, and sets at least one flip-flop grouped and placed at the input side of the scan chain to the at least one first flip-flop, and the scan path normalizer groups the "M" columns of the scan chain, sets at least one flip-flop grouped and placed at the output side of the scan chain to the at least one second flip-flop.

In addition, according to an embodiment of the present disclosure, the at least one first flip-flop includes a path selector and a scan flip-flop to convert a path in a column unit within the grouped scan chain, in response to the first control signal, and the at least one second flip-flop includes a path selector and a scan flip-flop to convert the path in a column unit within the grouped scan chain, in response to the second control signal.

In addition, according to an embodiment of the present disclosure, the first control signal and the second control signal are generated from a linear feedback shift register using an eigenvalue, which is stored in a chip to be inspected, as an initial seed, and allow a path of the first pattern to be converted in the column unit such that the path is obfuscated or normalized.

In addition, according to an embodiment of the present disclosure, the scan chain security circuit further includes at least one seed flip-flop interposed between the at least one first flip-flop and the at least one second flip-flop to receive the test pattern included in a K-th pattern and provide the test pattern as a seed of the linear feedback shift register, in which "K" is a natural number greater than or equal to 1 and less than "N".

In addition, according to an embodiment of the present disclosure, the first and second control signals are generated from the linear feedback shift register using the test pattern included in the K-th pattern as the seed to obfuscate or normalize a path of the second pattern to the N-th pattern by converting the path in the column unit.

In addition, according to an embodiment of the present disclosure, the scan data obfuscator is disposed in a last column of an output stage of the scan chain, to set at least one flip-flop, which is connected to the at least second flip-flop, as at least one third flip-flop to damage and obfuscate the output pattern sequence.

In addition, according to an embodiment of the present disclosure, the at least one third flip-flop includes a multiplexer and a scan flip-flop to damage and obfuscate the output test pattern in response to the second control signal.

In addition, according to an embodiment of the present disclosure, a method for driving a scan chain security circuit, includes receiving a first control signal by a scan path obfuscator to obfuscate a path of a pattern sequence input to at least one first flip-flop grouped at an input side of at least one scan chain, receiving a second control signal by a scan path normalizer to normalize the path of the pattern sequence input to at least one second flip-flop grouped at an outside of the scan chain, receiving a test key included in the pattern sequence by at least one dummy flip-flop interposed between the at least one first flip-flop and the at least one second flip-flop, and damaging and obfuscating, by a scan data obfuscator, an output test pattern which is output from the at least one second flip-flop, depending on whether a security key stored in a memory of a chip to be inspected is matched with the test key In addition, according to an embodiment of the present disclosure, a computer-readable non-transitory recording medium having a program for executing the method for driving the scan chain security circuit is provided.

Advantageous Effects of the Invention

According to the scan chain security circuit and the method for driving the same of the present disclosure, the scan chain security circuit for determining the shifting path for inputting the following pattern, based on the preceding pattern, as patterns subsequently input have correlation may be provided, such that the one-to-one correspondence between the pattern and the security key is removed.

According to the scan chain security circuit and the method for driving the same of the present disclosure, the security key used by the attacker or the probability of inference made by inputting the security key may be completely blocked, even if the patterns including the security key are exposed through the test engineer under the situation in which the reverse engineering is applied.

BEST MODE

Figure 1:
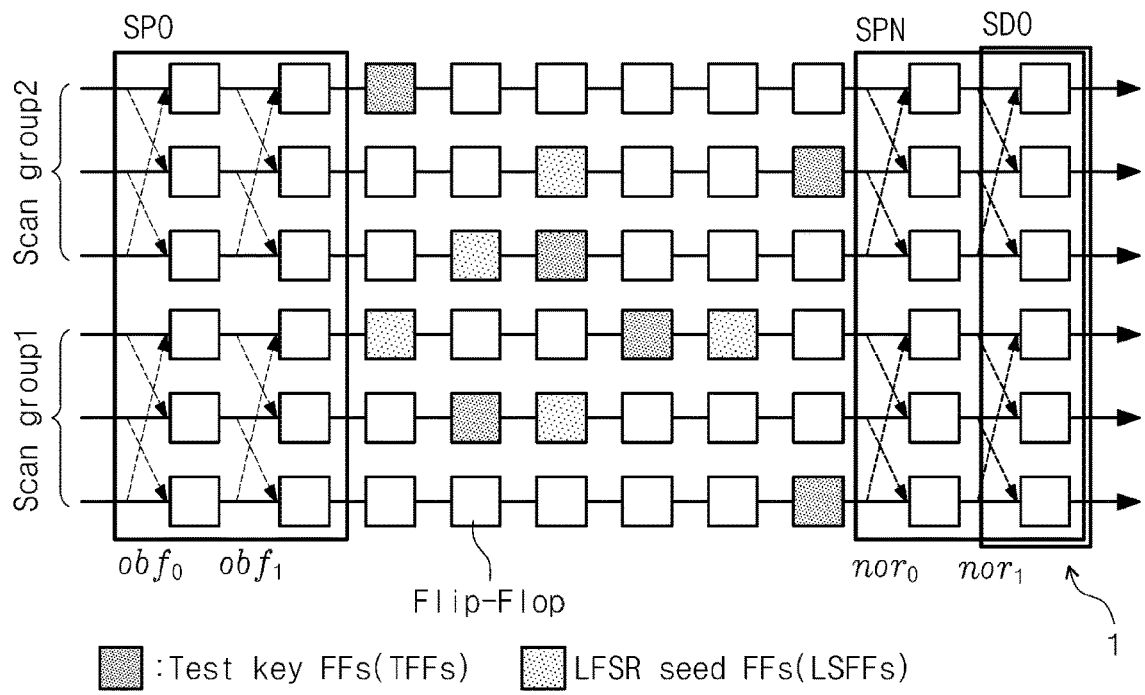
FIG. 1 is a view illustrating a scan chain security circuit according to an embodiment of the present disclosure.

Hereinafter, the embodiment of the present disclosure will be described in detail with reference to accompanying drawings to allow those skilled in the art to easily reproduce the present disclosure. However, the present disclosure may be implemented in various forms, and is limited to embodiments described herein.

A part irrelevant to the present disclosure will be omitted for clarity. Throughout the whole specification, the same or similar components will be assigned with the same reference numerals. In addition the reference numerals previously mentioned may be used for another drawing.

In addition, the size and the thickness of each component illustrated in the drawings may not be an actual size and an actual thickness for the convenience of explanation. Accordingly, the present disclosure is not limited thereto. In the accompanying drawings, the thickness may be exaggerated to clearly express several layers and several regions.

Further, in the following description, the wording "the same" may refer to the wording "substantially the same". In other words, the wording "the same" may refer to an extent that those skilled in the art accept the meaning of the wording "the same". Other wordings may be expressions including the wording "substantially".

In the following description, when a certain part "includes" a certain component, the certain part does not exclude other components, but may further include other components unless otherwise specified.

The term "unit" used herein may refer to unit for processing at least one function or operation. For example, the term "unit" may refer to a software component, an FPGA component, or a hardware component. The function provided in a "~ unit" may include a plurality of components separate from each other or may be integrated with an additional different component. Herein, the "~ unit" is not limited to software or hardware. In addition, the "~unit" may be configured to be in a storage medium to be addressed or may be configured to reproduce at least one processor. Hereinafter, an embodiment of the present disclosure will be described with reference to accompanying drawings in detail.

Figure 2:
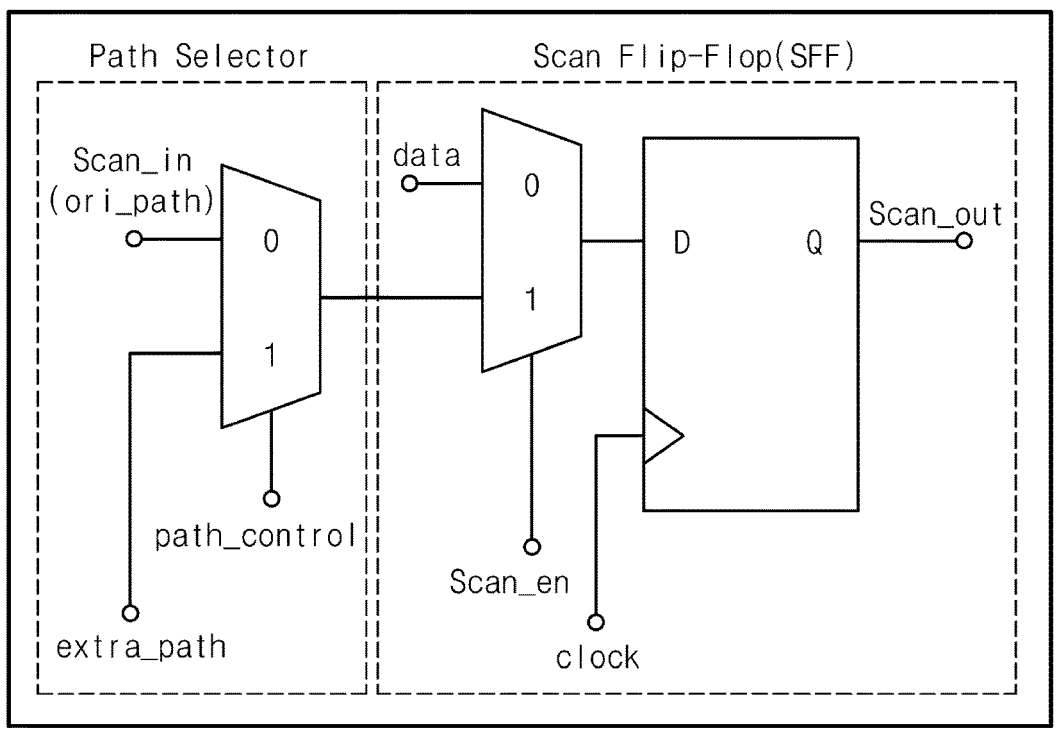
FIG. 2 is a view illustrating structures of first and second flip-flops to obfuscate and normalize a path of a pattern sequence, according to an embodiment of the present disclosure.

FIG. 1 is a view of a scan chain security circuit according to an embodiment of the present disclosure. FIG. 2 is a view of structures of first and second flip-flops to obfuscate and normalize a path of a pattern sequence, according to an embodiment of the present disclosure.

Referring to FIG. 1, a square shape represents a flip-flop constituting a scan chain. In addition, adjacent flip-flops are connected to each other in a straight line to form a scan chain.

Hereinafter, the following description will be made with reference to FIGS. 1 and 2.

A scan chain security circuit 1 according to an embodiment of the present disclosure may include a scan chain, a scan path obfuscator SPO, a scan path normalizer SPN, test key flip-flops TFFs, and a scan data obfuscator SDO.

However, to drive the scan chain security circuit 1 of FIG. 1, as smaller number or a larger number of components than the number of components illustrated in FIG. 1 may be provided.

The scan chain may include at least one flip-flop. Scan chains may be arranged in parallel with each other, and at least one flip-flop may be disposed in a column and row of the scan chain.

The scan path obfuscator SPO may set a scan group by grouping "M" rows of scan chains (where "M" is a natural number). Referring to FIG. 1, scan groups Scan Group1 and Scan Group2 set by grouping three rows of scan chains are illustrated.

The scan path obfuscator SPO may set at least one flip-flop, which is disposed at an input side of the grouped scan chains, to at least one first flip-flop.

The scan path obfuscator SPO may obfuscate a path of a pattern sequence input to at least one first flip-flop included in the grouped scan chains, in response to first control signals $obf_0$ and $obf_1$.

Specifically, the first control signals $obf_0$ and $obf_1$ may be generated from a linear feedback register (LFSR) using an eigenvalue, which is stored in a physical unclosable function (PUF) of a chip (not illustrated) to be inspected by the scan chain, as an initial seed.

The pattern sequence (or, first to N-th patterns, where "N" is a natural number) refers to a series of patterns input to the scan chain.

Referring to FIGS. 1 and 2 together, at least one first flip-flop may include a path selector and a scan flip-flop to convert a path of a pattern sequence in a row unit within the grouped scan chains, in response to first control signals path_control, $obf_0$, and $obf_1$.

At least one first flip-flop arranged in the same column in the grouped scan chains may convert the path of the pattern sequence in a row unit, in response to the same first control signals $obf_0$ and $obf_1$.

For example, a first flip-flop placed in a first column of a first row, a first flip-flop placed in a first column of a second row, and a first flip-flop placed in a first column of a third row may share the first control signal $obf_0$ with each other, and the path of the pattern sequence may be converted to a next row in response to the first control signal $obf_0$.

The pattern sequence input to the first flip-flops placed in the first column may be input to the first flip-flop placed in the first column of the second row, in response to the first control signal $obf_0$ applied to the path selector.

The pattern sequence input to the first flip-flops placed in the first column may be input to the first flip-flop placed in the first column of the third row, in response to the first control signal $obf_0$ applied to the path selector.

The pattern sequence input to the first flip-flops placed in the first column may be input to the first flip-flop placed in the first column of the first row in response to the first control signal $obf_0$ applied to the path selector.

In this case, converting the path of the pattern sequence in response to the first control signal $obf_0$ described above may be simultaneously performed in the first, second, and third rows.

The scan path normalizer SPN may set at least one flip-flop placed at an output side of the grouped scan chains to at least one second flip-flop.

The scan path normalizer SPN may normalize a path of a pattern sequence input to at least one second flip-flop in response to second control signals $nor_0$ and $nor_1$.

The second control signals $nor_0$ and nor may be determined through a truth table according to the first control signal of FIG. 5 to be described later, and the details thereof will be described with reference to FIG. 5.

Referring to FIGS. 1 and 2 together, at least one second flip-flop may include a path selector and a scan flip-flop to convert a path of a pattern sequence, which is provided in the grouped scan chains, in row unit, in response to the second control signal path_control, $nor_0$, and $nor_1$.

At least one second flip-flop arranged in the same column with the grouped scan chains may path-convert the pattern sequence in row unit by the same second control signal $nor_0$ and $nor_1$.

For example, the second flip-flops placed in a ninth column of a first row, a ninth column of a second row, and a ninth column of a third row may share the second control signal $nor_0$ with each other, and may convert the path of the pattern sequence to a next row.

Specifically, the pattern sequence input to the second flip-flop placed in the ninth column of the first row may be input to the second flip-flop placed in the ninth column of the second row in response to the second control signal nor0 applied to the path selector.

The pattern sequence input to the second flip-flop arranged in the ninth column of the second row may be input to the second flip-flop placed in the ninth column of the third row in response to the second control signal nor0 applied to the path selector.

The pattern sequence input to the second flip-flop placed in the ninth column of the third may be input to the second flip-flop placed in the ninth column of the first row in response to the second control signal nor0 applied to the path selector.

In this case, converting the path of the pattern sequence in response to the second control signal $nor_0$ described above may be performed simultaneously in the first, second, and third rows.

The dummy flip-flop (or test key flip-flop; TFFs) is interposed between at least one first flip-flop and at least one second flip-flop, to receive a test key included in the pattern sequence.

The dummy flip-flop (or test key flip-flop; TFFs) is not connected to the chip to be inspected (not illustrated), and may receive only the test key of the pattern sequence output from at least one first flip-flop.

The seed flip-flop (or LFSR seed FFs, LSFFs) is interposed between at least one first flip-flop and at least one second flip-flop and may receive a test pattern included in a K-th pattern (where "K" is a natural number greater than or equal to 1 and less than N).

The seed flip-flop (or LFSR seed FFs or LSFFs) may provide the input test pattern as a new seed of the linear feedback shift register LFSR.

According to the present disclosure, when a first pattern is input as at least one first flip-flop, the path of the first pattern may be converted and obfuscated in response to a first control signal generated from the linear feedback register (LFSR) using an eigenvalue, which is stored in the physical incompatible function PUF of a chip (not illustrated) to be inspected, as an initial seed.

Meanwhile, in the second pattern to the N-th pattern after the first pattern, a test pattern included in a previously applied pattern may be input to a seed flip-flop (or LFSR seed FFs; LSFFs), and the seed flip-flop (or LFSR seed FFs; LSFFs) may provide the input test pattern as a new seed in the linear feedback register (LFSR).

A first control signal may be generated by using a new seed of the linear feedback register (LFSR).

In other words, after the first pattern, the path of a pattern sequence may be dynamically converted and obfuscated using the first control signal generated from the linear feedback register (LFSR) by using the test pattern input to the seed flip-flop (or LFSR seed FFs, LSFFs) as a seed.

The scan data obfuscator SDO may be disposed in the last column of an output stage of the scan chain, and may set at least one flip-flop, which is connected to at least second flip-flop, as at least one third flip-flop.

The scan data obfuscator SDO may damage and obfuscate an output pattern sequence which is output from at least one second flip-flop depending on whether a security key stored in the memory of the chip to be inspected is matched with the test key.

The details of the structure of the third flip-flop and of the process of damaging and obfuscating an output pattern sequence by the scan data obfuscator SDO will be described in detail later in FIG. 7.

Meanwhile, a first pattern of the pattern sequence input to at least one first flip-flop, may include only the test pattern. The second pattern to the N-th pattern, which are subsequent to the first pattern of the pattern sequence input to the at least one first flip-flop may include both a test pattern a test key.

In other words, as described above with reference to FIG. 1, the first control signals obf0 and obf1 may be generated from the linear feedback register (LFSR) using an eigenvalue, which is stored in the physical incompatible function PUF of a chip (not illustrated) to be inspected, as an initial seed, and the path of the first pattern may be converted to a path determined in response to the first control signal.

In this case, the first pattern is a fake pattern having only of a test pattern without the test key. Accordingly, the security key stored in the memory of the chip to be inspected may not be matched with the test key.

Accordingly, the scan data obfuscator SDO may damage and obfuscate the first pattern, thereby improving security.

Figure 3:
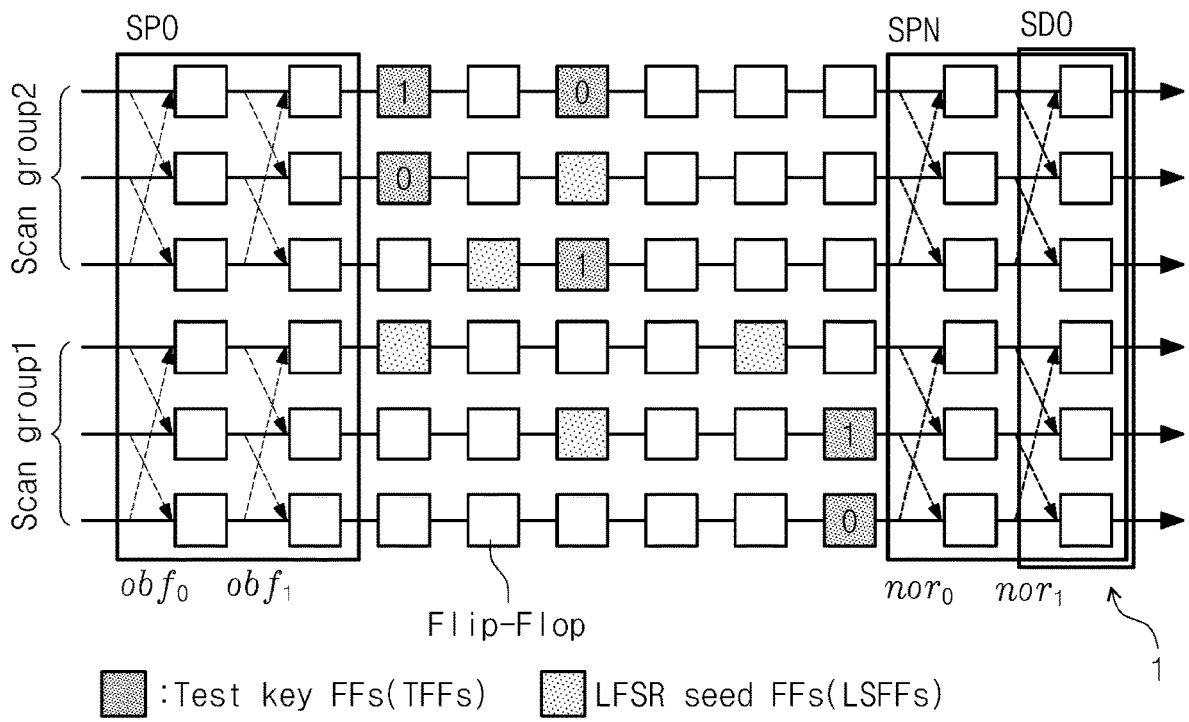
FIG. 3 is a view illustrating an arrangement of a flip-flop to which a test key is input according to an embodiment of the present disclosure.

FIG. 3 is a view illustrating an arrangement of a flip-flop to which a test key is input, according to an embodiment of the present disclosure.

As described above with reference to FIG. 1, at least one dummy flip-flop (or test key flip-flop; TFFs) may be disposed between at least one first flip-flop and at least one second flip-flop.

Specifically, referring to FIG. 3, scan chains of the scan chain security circuit 1 may be grouped into two scan groups (Scan Group 1 and Scan Group 2). Referring to the scan groups (Scan Group 1 and Scan Group 2), at least one flip-flop may be connected together to form three rows, respectively.

The dummy flip-flop (or test key flip-flop; TFFs) are illustrated in a dark gray square shape. Hereinafter, Scan group 1 will be described by way of example.

At least one dummy flip-flop (or test key flip-flop; TFFs) may include two pairs of flip-flops provided in one column within Scan Group 1.

In this case, as described in FIG. 1, the values of test keys required by at least one dummy flip-flop (or test key flip-flop, TFFs) may be designated as opposite values.

For example, dummy flip-flops may be placed in the third columns of the first row and the second row, among flip-flops placed within Scan Group 1.

In this case, a value of the test key required by the dummy flip-flop placed in the third column of the first row may be set to "1", and a value of the test key required by the dummy flip-flop placed in the third column of the second row may be set to "0".

In addition, dummy flip-flops may be placed in fifth columns of the first row and the third row, among the flip-flops placed within Scan Group 1.

In this case, a value of the test key required by the dummy flip-flop placed in the fifth column of the first row may be set to "0", and a value of the test key required by the dummy flip-flop placed in the third column of the third row may be set to "1".

According to the present disclosure, when the values of the test keys required by the dummy flip-flops are specified with opposite values in the scan group, the number of cases in which the values of the test keys may be input rapidly increases, thereby improving security.

Figure 4:
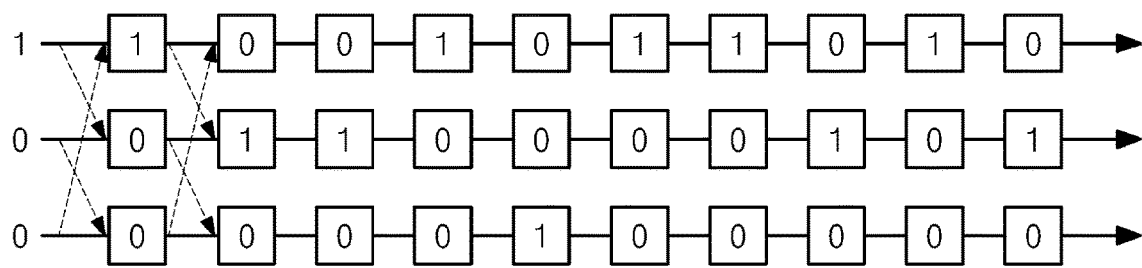
FIG. 4 is an example of an attack for inferring an initial seed.

FIG. 4 is an example of an attack for inferring an initial seed.

As described above with reference to FIG. 1, when the first pattern is input to at least one first flip-flop, the path of the first pattern may be converted and obfuscated by using the first control signal generated from the linear feedback register (LFSR) using the eigenvalue, which is stored in the physical unclonable function (PUF) of the chip (not illustrated) to be inspected, as an initial seed.

In this case, for the first pattern, path conversion may be inferred through a simple path conversion-based attack as illustrated in FIG. 4.

Specifically, it is possible to infer how the path has actually been changed in each clock by entering a value, which is opposite to a value in a different row, in one row within the scan group, continuing the path conversion, and analyzing an output value repeatedly.

Figures 5, 6:
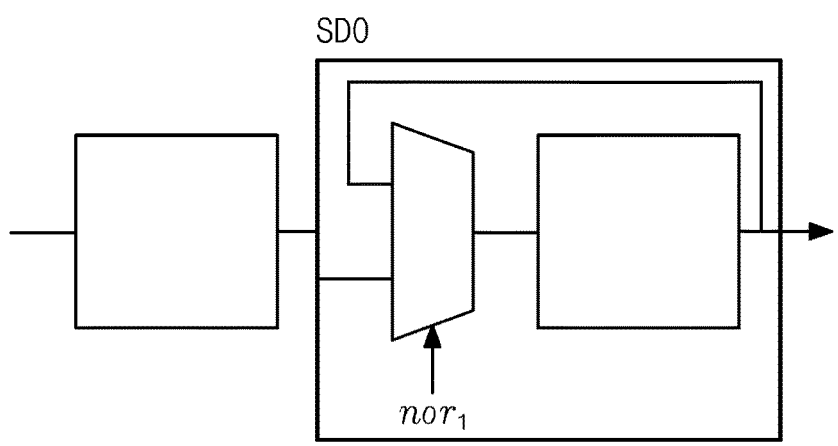
FIG. 5 illustrates truth tables for first and second control signals according to an embodiment of the present disclosure.
FIG. 6 is a view illustrating a structure of a third flip-flop to damage and obfuscate an output pattern sequence according to an embodiment of the present disclosure.

FIG. 5 illustrates truth tables for first and second control signals according to an embodiment of the present disclosure.

As described above with reference to FIG. 1, the scan path obfuscator SPO may obfuscate the path of a pattern sequence input to at least one first flip-flop in response to the first control signals $obf_0$ and $obf1$.

In this case, to prevent the path conversion inference described above with reference to FIG. 4, the scan path normalizer SPN of the scan chain security circuit 1 according to the present disclosure may normalize the path of the pattern sequence input to at least one second flip-flop in response to the second control signals $nor0$, or $nor1$.

In other words, the path of the pattern sequence obfuscated through at least one second flip-flop may be normalized and output, and an external attacker may only check out an output pattern sequence output as the path is normalized. Accordingly, path conversion may not be inferred as illustrated in FIG. 4.

Meanwhile, the second control signals $nor_0$, $nor_1$, $nor_2$, . . . , for normalizing the path of the pattern sequence input to at least one second flip-flop by the scan path normalizer SPN may be determined by a truth table in response to the first control signal of FIG. 5.

Specifically, the sum of a value set for second control signal applied to at least one second flip-flop in each row in the scan group and a value set for the first control signal applied to at least one first flip-flop may be set to be 0 or to be a multiple of the size of the scan group (or the number of rows in the scan group; $N_{sg}$).

For example, when the size $N_{sg}$ of the scan group is "2", and when the value of the first control signal $obf_0$ applied to the first flip-flop placed in the first row of the scan group is set to "0", the value of the second control signal $nor_0$ applied to the second flip-flop may be set to "0".

In addition, when the value of the first control signal $obf_0$ applied to the second flip-flop placed in the second row of the scan group is set to "1", the value of the second control signal nor$_0$ applied to the second flip-flop may be set to "1".

When the size N$_{sg}$ of the scan group is "3", the values of the first control signals obf$_0$ and obf$_1$ applied to the first flip-flop placed in the first row of the scan group are set to "0, 0", respectively, and the values of the second control signals nor$_0$ and nor$_1$ applied to the second flip-flop may be set to "0, 0", respectively.

When the values of the first control signals obf$_0$ and obf$_1$ applied to the first flip-flop placed in the second row of the scan group are set to "0, and 1", the values of the control signals nor$_0$ and nor$_1$ applied to the second flip-flop may be set to "1 and 1", respectively.

When the values of the first control signals obf$_0$ and obf$_1$ applied to the first flip-flop placed in the third row in the scan group are respectively set to "1 and 0", the values of the second control signals nor$_0$ and nor$_1$ applied to the second flip-flop may be respectively set to "1 and 1".

When the values of the first control signals obf0 and obf1 applied to the first flip-flop placed in the fourth row of the scan group are respectively set to "1 and 1", the values of the second control signals nor$_0$ and nor$_1$ applied to the second flip-flop may be respectively set to "1 and 0".

When the size N$_{sg}$ of the scan group is "4", and when the values of the first control signals obf0, obf1, and obf2 applied to the first flip-flop placed in the first row of the scan group are respectively set to "0, 0, and 0", the values of the second control signals nor$_0$, nor$_1$, and nor$_2$ applied to the second flip-flop may be set to "0, 0, and 0", respectively.

When the values of the first control signals obf$_0$, obf$_1$, and obf$_2$ applied to the first flip-flop placed in the second row of the scan group are set to "0, 0, and 1", the values of the second control signals nor$_0$, nor$_1$, and nor$_2$ applied to the second flip-flop may be set to "1, 1, and 1", respectively.

When the values of the first control signals obf0, obf1, and obf2 applied to the first flip-flop placed in the third row in the scan group are set to "0, 1, and 0", the values of the second control signals nor0, nor1, and nor2 applied to the second flip-flop may be set to "1, 1, and 1", respectively.

When the values of the first control signals obf$_0$, obf$_1$, and obf$_2$ applied to the first flip-flop placed in the fourth rows in the scan group are set to "0, 1, and 1", the values of the second control signals nor$_0$, nor$_1$, and nor$_2$ applied to the second flip-flop may be set to "1, 1, and 0", respectively.

When the values of the first control signals obf$_0$, obf$_1$, and obf$_2$ applied to the first flip-flop placed in the fifth row of the scan group are set to "1, 0, and 0", the values of the second control signals nor0, nor1, nor2 applied to the second flip-flop may be set to "1, 1, and 1", respectively.

When the values of the first control signals obf$_0$, obf$_1$, and obf$_2$ applied to the first flip-flop placed in the sixth row of the scan group are respectively set to "1, 0, and 1", the values of the second control signals nor$_0$, nor$_1$, and nor$_2$ applied to the second flip-flop may be respectively set to "1, 1, and 0".

When the values of the first control signals obf$_0$, obf$_1$, and obf$_2$ applied to the first flip-flop placed in the seventh row in the scan group are respectively set to "1, 1, and 0", the values of the second control signals nor$_0$, nor$_1$, and nor$_2$ applied to the second flip-flop may be respectively set to "1, 1, and 0".

When the values of the first control signals obf$_0$, obf$_1$, and obf$_2$ applied to the first flip-flop placed in the eighth row of the scan group are respectively set to "1, 1, and 1", the values of the second control signals nor$_0$, nor$_1$, and nor$_2$ applied to the second flip-flop may be respectively set to "1, 0, and 0".

Meanwhile, unlike the case where the size of the scan group N$_{sg}$ is "2", the first control signal and the second control signal are not symmetrical because the first control signal and the second control signal do not correspond one-to-one, within the scan group having the size N$_{sg}$ of "3" or more.

Specifically, when the size N$_{sg}$ of the scan group is "2", the value of the first control signal obf$_0$ applied to the first flip-flop placed in the first row of the scan group is "0", and the value of the second control signal nor$_0$ applied to the second flip-flop is "0", which are symmetrical to each other because the first control signal and the second control signal are one-to-one correspondence.

In addition, the value of the first control signal obf$_0$ applied to the second flip-flop placed in the second row within the scan group is "1", and the value of the second control signal nor$_0$ applied to the second flip-flop is "1", which are symmetrical to each other because the first control signal and the second control signal are one-to-one correspondence.

On the other hand, when the size N$_{sg}$ of the scan group is "3", the values of the first control signals obf$_0$, and obf$_1$ applied to the first flip-flop placed in the second row in the scan group are "0, and 1", and the values of the second control signals nor$_0$, and nor$_1$ applied to the second flip-flop are "1, and 1", which are not symmetrical to each other because the first control signal and the second control signal are not one-to-one correspondence.

In addition, the values of the first control signals obf$_0$, and obf$_1$ applied to the first flip-flop placed in the third row of the scan group are "1, and 0", and the values of the second control signals nor$_0$, and nor$_1$ applied to the second flip-flop are "1, are 1", which are not symmetrical to each other because the first control signal and the second control signal are not one-to-one correspondence.

In addition, the values of the first control signals obf$_0$, and obf$_1$ applied to the first flip-flop placed in the fourth row of the scan group are "1, and 1", and the values of the second control signals nor$_0$, and nor$_1$ applied to the second flip-flop are "1, 0", respectively, which are not symmetrical to each other because the first control signal and the second control signal are not one-to-one correspondence.

This is the same even when the size N$_{sg}$ of the scan group is "4". Meanwhile, as the size N$_{sg}$ of the scan group increases, greater hardware overhead is required. Accordingly, the size N$_{sg}$ of the scan group may be set to "3" to increase security by increasing the difficulty of circuit analysis.

FIG. 6 is a view illustrating a structure of a third flip-flop to damage and obfuscate an output pattern sequence according to an embodiment of the present disclosure.

The scan data obfuscator SDO may be set to at least one third flip-flop placed in the last column at the output stage of the scan chain to damage and obfuscate a test pattern output at least one flip-flop connected to at least one second flip-flop.

The at least one third flip-flop may include a multiplexer and a scan flip-flop to damage and obfuscate the output test pattern in response to the second control signal.

In this case, the second control signal may be determined as a second control signal having the highest inversion probability among the second control signals applied to the scan path normalizer SPN based on the truth table of FIG. 5.

For example, referring to FIG. 5, when the size of the scan group size N$_{sg}$ is "3", based on a row, the second control signal nor is determined as the value of "0" in the first row, the value of "1" in the second row, the value of "1" in the third row, and the value of "0" in the fourth row, which makes have an inversion probability higher than that of the second control signal nor$_0$.

The determined second control signal may be applied to the multiplexer, and the output test pattern may be damaged and obfuscated by the multiplexer operating in response to the second control signal.

Figure 7:
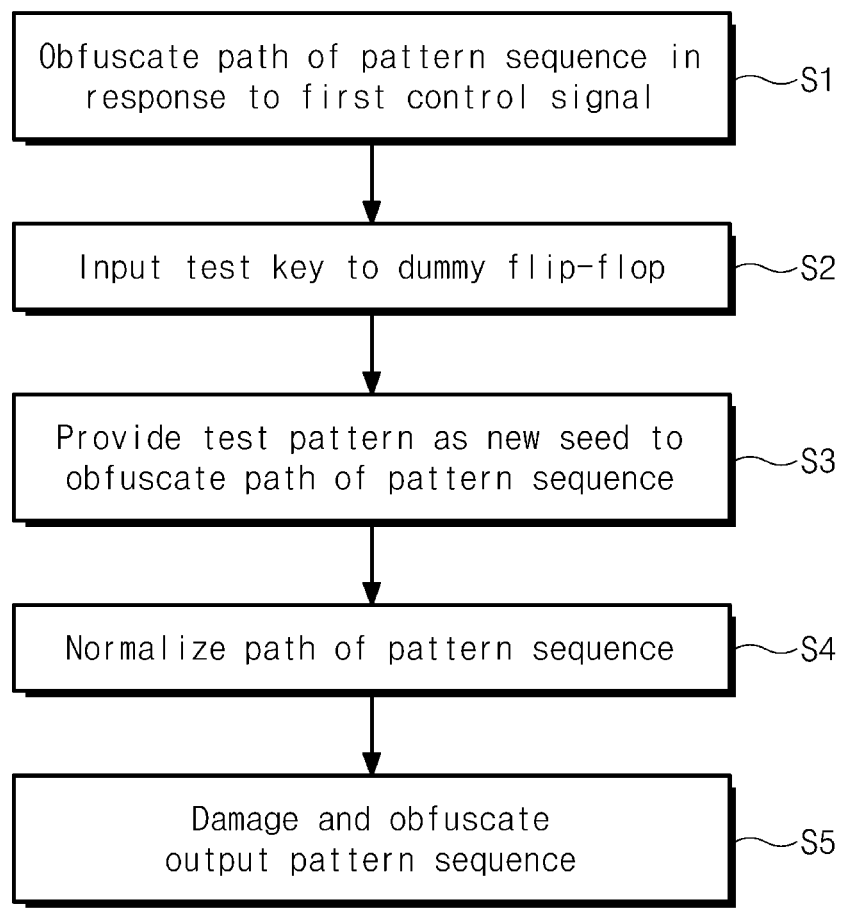
FIG. 7 is a flowchart illustrating a method for driving a scan chain security circuit according to an embodiment of the present disclosure.

FIG. 7 is a flowchart illustrating a method for driving a scan chain security circuit according to an embodiment of the present disclosure.

In S1, the path of the pattern sequence may be obfuscated in response to the first control signal.

Specifically, the scan path obfuscator (SPO) may obfuscate the path of the pattern sequence input to at least one first flip-flop in response to the first control signal.

The first control signal may be generated by using the first control signal generated from the linear feedback register (LFSR) using the eigenvalue, which is stored in the physical unclonable function (PUF) of the chip (not illustrated) to be inspected, as an initial seed, and may be used to obfuscate the path of the first pattern of the pattern sequence.

Meanwhile, the second pattern to the N-th pattern after the first pattern in the pattern sequence may be obfuscated by changing the path input to at least one first flip-flop in response to the first control signal generated in S3 thereafter.

In S2, the test key may be input through a dummy flip-flop.

Specifically, the test key included in the second pattern to the N-th patterns may be input to the dummy flip-flop.

In S3, the test pattern may be provided as a new seed to obfuscate the path of the pattern sequence.

Specifically, the seed flip-flop (or LFSR seed FFs; LSFFs) may receive a test pattern included in the K-th pattern.

The seed flip-flop (or LFSR seed FFs; LSFFs) may provide the test pattern as a new seed of the linear feedback shift register (LFSR), and the shift register may generate the first control signal using the test pattern.

In S4, the path of the pattern sequence may be normalized.

Specifically, the second control signal may be determined by the truth table of FIG. 5, and the scan path normalizer SPN may normalize the path of the pattern sequence input to at least one second flip-flop in response to the second control signal.

In S5, the output pattern sequence may be damaged and obfuscated.

Specifically, the scan data obfuscator SDO may damage and obfuscate the output pattern sequence output from at least one second flip-flop depending on whether the test key is matched with the security key stored in the memory of the chip to be inspected.

The drawings referenced so far and the detailed descriptions of the present disclosure described are merely provided for the illustrative purpose of the present disclosure, and is not used to limit the meaning or to limit the scope of the present disclosure described in the claims Therefore, those of ordinary skill in the art will understand that various modifications and other equivalent embodiments are possible therefrom Accordingly, the true technical protection scope of the present disclosure should be determined by the technical idea of the appended claims The embodiments described above may be implemented in the form of a hardware component, a software component, and/or the combination of hardware components and software components. For example, the apparatus, the method and the component described in embodiments may be implemented with, for example, at least one general computer or special computer, like another apparatus that is able to run a processor, a controller, an arithmetic logic unit (ALU), a digital signal processor, a micro-computer, a field programmable array (FPA), a programmable logic unit (PLU), a micro-processor, or an instruction.

A processing unit may run an operating system (OS) and at least one software application executed on the OS. In addition, the processing unit may access, store, manipulate, process, and create data in response to the execution of software. For convenience of understanding, there are cases where one processing device has been described as being used, but those skilled in the art will understand that the processing device may include a plurality of processing elements and/or a plurality of types of processing elements.

For example, the processing device may include a plurality of processor, or one processor and one controller. In addition, another processing component such as a parallel processor is possible. Software may include computer program, a code, an instruction, or the combination thereof. The software is to configure the processing device for a desired operation, or to instruction the processing device independently or collectively.

Software and/or data may be permanently or temporarily embodied in any type of machine, components, physical equipment, virtual equipment, computer storage media or units so as to be interpreted by the processing unit or to provide instructions or data to the processing unit. Software may be distributed on a computer system connected thereto over a network, and may be stored or executed in a distribution manner. The software or data may be stored in at least one computer-readable recording medium.

The method according to an embodiment may be implemented in the form of a program instruction which is executed through various computer units, and may be recorded in a computer-readable recording medium. The computer-readable recording medium may include a single program instruction, a single data file, or a single data structure or the combination thereof. The program instruction recorded in the medium is particularly designed and configured for an embodiment, or well known by those skilled in the art and used.

Examples of computer-readable recording media include magnetic media, such as a hard disk, a floppy disk, and a magnetic tape, optical media, such as a ROM, or a DVD, optical media, such as a floppy disk, and a hardware device, such as a ROM, a RAM, a flash memory, that is specially configured to store and execute a program instruction. In addition the program may include not only a mechanical code such as things generated by a compiler but also a high-level language code executable on a computer using an interpreter. The hardware device may be configured to operate as at least one software module to execute the operation according to an embodiment. In addition, the software module may be configured to operate as at least one hardware device to execute the operation according to an embodiment.

Hereinabove, although the present disclosure has been described with reference to embodiments and the accompanying drawings, the present disclosure is not limited thereto, but may be variously modified and altered by those skilled in the art to which the present disclosure pertains without departing from the spirit and scope of the disclosure claimed in the following claims. For example, a proper result may be derived even if the above described operations may be performed in sequence different from that of the described manner and/or the components, such as the system, the structure, the device, and the circuit described, are coupled or combined in the form different from the described-manner, or embodied, or substituted by other components or other equivalents. Therefore, other implementations, other embodiments, or equivalents of the claim fail to the scope of the following claims.

DESCRIPTION OF REFERENCE NUMERALS

1: scan chain security circuit

What is claimed is:

1. A scan chain security circuit comprising:
   a scan chain including at least one flip-flop;
   a scan path obfuscator configured to obfuscate a path of a pattern sequence input to at least one first flip-flop grouped at an input side of the scan chain, in response to a first control signal;
   a scan path normalizer configured to normalize the path of the pattern sequence input to at least one second flip-flop grouped at an outside of the scan chain, in response to a second control signal;
   at least one dummy flip-flop interposed between the at least one first flip-flop and the at least one second flip-flop to receive a test key included in the pattern sequence; and
   a scan data obfuscator configured to damage and obfuscate an output pattern sequence output from the at least one second flip-flop, depending on whether a security key stored in a memory of a chip to be inspected is matched with the test key.

2. The scan chain security circuit of claim 1, wherein the at least one first flip-flop receives only a first pattern, which includes only a test pattern, in the pattern sequence, and sequentially receives a second pattern to an N-th pattern including the test key and the test pattern after the first pattern, in which "N" is a natural number.

3. The scan chain security circuit of claim 1, wherein the scan path obfuscator groups "M" columns of the scan chain, and sets at least one flip-flop grouped and placed at the input side of the scan chain to the at least one first flip-flop, and
   wherein the scan path normalizer groups the "M" columns of the scan chain, sets at least one flip-flop grouped and placed at the output side of the scan chain to the at least one second flip-flop, in which "M" is a natural number.

4. The scan chain security circuit of claim 2, wherein the at least one first flip-flop includes:
   a path selector and a scan flip-flop to convert a path in a column unit within the grouped scan chains, in response to the first control signal, and,
   wherein the at least one second flip-flop includes:
   a path selector and a scan flip-flop to convert the path in a column unit within the grouped scan chains, in response to the second control signal.

5. The scan chain security circuit of claim 4, wherein the first control signal and the second control signal are generated from a linear feedback shift register using an eigenvalue, which is stored in a chip to be inspected, as an initial seed, and allow a path of the first pattern to be converted in the column unit such that the path is obfuscated or normalized.

6. The scan chain security circuit of claim 5, further comprising:
   at least one seed flip-flop interposed between the at least one first flip-flop and the at least one second flip-flop to receive the test pattern included in a K-th pattern and provide the test pattern as a seed of the linear feedback shift register, in which "K" is a natural number greater than or equal to 1 and less than "N".

7. The scan chain security circuit of claim 6, wherein the first and second control signals are generated from the linear feedback shift register using the test pattern included in the K-th pattern as the seed to obfuscate or normalize a path of the second pattern to the N-th pattern by converting the path in the column unit.

8. The scan chain security circuit of claim 1, wherein the scan data obfuscator is disposed in a last column of an output stage of the scan chain, to set at least one flip-flop, which is connected to the at least second flip-flop, as at least one third flip-flop to damage and obfuscate the output pattern sequence.

9. The scan chain security circuit of claim 8, wherein the at least one third flip-flop includes a multiplexer and a scan flip-flop to damage and obfuscate the output test pattern in response to the second control signal.

10. A method for driving a scan chain security circuit, the method comprising:
    receiving a first control signal by a scan path obfuscator to obfuscate a path of a pattern sequence input to at least one first flip-flop grouped at an input side of at least one scan chain;
    receiving a second control signal by a scan path normalizer to normalize the path of the pattern sequence input to at least one second flip-flop grouped at an outside of the scan chain;
    receiving a test key included in the pattern sequence by at least one dummy flip-flop interposed between the at least one first flip-flop and the at least one second flip-flop; and
    damaging and obfuscating, by a scan data obfuscator, an output test pattern which is output from the at least one second flip-flop, depending on whether a security key stored in a memory of a chip to be inspected is matched with the test key.

11. A computer-readable non-transitory recording medium having a program for executing the method for driving the scan chain security circuit of claim 10.

* * * * *